(12) United States Patent
Fujii et al.

(10) Patent No.: US 8,461,570 B2
(45) Date of Patent: Jun. 11, 2013

(54) SEMICONDUCTOR DEVICE AND MANUFACTURING METHOD THEREOF

(75) Inventors: Kei Fujii, Itami (JP); Takashi Ishizuka, Itami (JP); Katsushi Akita, Itami (JP); Youichi Nagai, Osaka (JP); Tatsuya Tanabe, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 104 days.

(21) Appl. No.: 13/127,005

(22) PCT Filed: Jul. 7, 2010

(86) PCT No.: PCT/JP2010/061511
§ 371 (c)(1),
(2), (4) Date: Apr. 29, 2011

(87) PCT Pub. No.: WO2011/016309
PCT Pub. Date: Feb. 10, 2011

(65) Prior Publication Data
US 2011/0210313 A1    Sep. 1, 2011

(30) Foreign Application Priority Data

Aug. 1, 2009 (JP) ................................. 2009-180242
Sep. 7, 2009 (JP) ................................. 2009-206317

(51) Int. Cl.
*H01L 31/0352* (2006.01)
*H01L 31/0256* (2006.01)
*G02F 1/017* (2006.01)

(52) U.S. Cl.
USPC ........................ 257/21; 257/22; 257/E31.033

(58) Field of Classification Search
None
See application file for complete search history.

(56) References Cited

U.S. PATENT DOCUMENTS 4,904,616 A * 2/1990 Bohling et al. ............... 117/104
5,077,593 A * 12/1991 Sato et al. ........................ 257/21
5,510,627 A * 4/1996 Snow .............................. 257/21

(Continued)

FOREIGN PATENT DOCUMENTS

| JP | 2004-207588 A | 7/2004 |
| JP | 2005-197395 A | 7/2005 |
| JP | 2006-190853 A | 7/2006 |
| WO | WO-2010/073768 A1 | 7/2010 |

OTHER PUBLICATIONS

Sidhu, R.; Ning Duan; Campbell, J.C.; Holmes, A.L., Jr., "A long-wavelength photodiode on InP using lattice-matched GaInAs—GaAsSb type-II quantum wells," Photonics Technology Letters, IEEE, vol. 17, No. 12, pp. 2715-2717, Dec. 2005.*

(Continued)

*Primary Examiner* — Thomas L Dickey
*Assistant Examiner* — Joseph Schoenholtz
(74) *Attorney, Agent, or Firm* — Venable LLP; Michael A. Sartori; Tamatane J. Aga

(57) ABSTRACT

A method for manufacturing a semiconductor device, by which a multiple quantum well structure having a large number of pairs can be efficiently grown while maintaining good crystalline quality, and the semiconductor device, are provided. The semiconductor device manufacturing method of the present invention includes a step of forming a multiple quantum well structure 3 having 50 or more pairs of group III-V compound semiconductor quantum wells. In the step of forming the multiple quantum well structure 3, the multiple quantum well structure is formed by metal-organic vapor phase epitaxy using only metal-organic sources (all metal-organic source MOVPE).

7 Claims, 6 Drawing Sheets

U.S. PATENT DOCUMENTS

| | | | |
|---|---|---|---|
| 6,005,259 A * | 12/1999 | Su et al. | 257/15 |
| 6,420,728 B1 * | 7/2002 | Razeghi | 257/14 |
| 6,711,195 B2 * | 3/2004 | Chang et al. | 372/45.01 |
| 6,888,179 B2 * | 5/2005 | Uppal | 257/190 |
| 6,982,439 B2 * | 1/2006 | Bhat et al. | 257/104 |
| 7,053,293 B2 * | 5/2006 | Uppal | 136/253 |
| 8,124,959 B2 * | 2/2012 | Hudait et al. | 257/14 |
| 2007/0012908 A1 * | 1/2007 | Kunert et al. | 257/12 |
| 2007/0217457 A1 * | 9/2007 | Stolz et al. | 372/43.01 |
| 2012/0032147 A1 * | 2/2012 | Nagai et al. | 257/21 |
| 2012/0326122 A1 * | 12/2012 | Fujii et al. | 257/14 |

OTHER PUBLICATIONS

Sidhu, R.; Ning Duan; Campbell, J.C.; Holmes, A.L., Jr.; , "A long-wavelength photodiode on InP using lattice-matched GaInAs—GaAsSb type-II quantum wells," Photonics Technology Letters, IEEE , vol. 17, No. 12, pp. 2715-2717, Dec. 2005.*

Peter et al., "Light-emitting diodes and laser diodes based on a $Ga_{1-x}In_xAs/GaAs_{1-y}Sb_y$ type II superlattice on InP substrate," Applied Physics Letters, vol. 74, No. 14, pp. 1951-1953 (1999).

Sidhu et al., "A 2.3μm cutoff wavelength photodiode on InP using lattice-matched GaInAs—GaAsSb type-II quantum wells," 2005 International Conference on Indium Phosphide and Related Materials, Nov. 14, 2008 from IEEE Xplore, pp. 148-151 (2005).

Kuech et al., "MOVPE growth of antimonide-containing alloy materials for long wavelength applications," Journal of Crystal Growth, vol. 310, pp. 4826-4830 (2008).

Horita et al., "Metalorganic vapor phase epitaxy growth of InGaAsP multi quantum well laser diodes using entirely organic sources," Journal of Crystal Growth, vol. 145, pp. 886-891 (1994).

Sidhu et al., "A long-wavelength photodiode on InP using lattice-matched GaInAs—GaAsSb type-II quantum wells," IEEE Photonics Technology Letters, vol. 17, No. 12, pp. 2715-2717 (2005).

Plis et al., "Midwave infrared type-II InAs/GaSb superlattice detectors with mixed interfaces," Journal of Applied Physics, vol. 100, pp. 014510-1-014510-4 (2006).

Seltzer et al,., "Reliable 1.5 μm buried heterostructure, separate confinement, multiple quantum well (BH-SC-MQW) lasers entirely grown by metalorganic vapour-phase epitaxy (MOVPE))," IEEE Electronics Letters, vol. 25, No. 21, pp. 1449-1451 (1989).

* cited by examiner

SEMICONDUCTOR DEVICE AND MANUFACTURING METHOD THEREOF

TECHNICAL FIELD

The present invention relates to a group III-V semiconductor device and a manufacturing method thereof. More particularly, the invention relates to: a semiconductor device which includes a high-quality multiple quantum well structure having responsivity in a long-wavelength region of the near infrared, and which can be manufactured efficiently; and a method for manufacturing the semiconductor device.

BACKGROUND ART

Non-Patent Literature 1 discloses a photodiode in which an InGaAs/GaAsSb type II multiple quantum well structure is formed on an InP substrate as a group III-V compound semiconductor substrate to realize a cutoff wavelength of 2 μm or more.

Non-Patent Literature 2 discloses an LED in which an InGaAs—GaAsSb type II quantum well structure is formed as an active layer on an InP substrate to realize an emission wavelength of 2.14 μm.

Patent Literature 1 discloses a semiconductor laser device having a GaInNAsSb quantum well structure. The GaInNAsSb quantum well structure is a single quantum well structure (number of pairs=1),

CITATION LIST

Patent Literature

[Patent Literature 1] Japanese Laid-Open Patent Publication No. 2005-197395

Non-Patent Literature

[Non-Patent Literature 1] R. Sidhu, "A Long-Wavelength Photodiode on InP Using Lattice-Matched GaInAs—GaAsSb Type-II Quantum Wells", IEEE Photonics Technology Letters, Vol. 17, No. 12 (2005), pp. 2715-2717

[Non-Patent Literature 2] M. Peter, "Light-emitting diodes and laser diodes based on a $Ga_{1-x}In_xAs/GaAs_{1-y}Sb_y$ type II superlattice on InP substrate" Appl. Phys. Lett., Vol. 74, No. 14 (1999), pp. 1951-1953

In the above-described Non-Patent Literature 1, strain compensation is required in order to realize a longer wavelength. So, Non-Patent Literature 1 proposes a photodetector having a cutoff wavelength of 2 μm to 5 μm, which is realized by a Ga(In)AsSb—GaInAs(Sb) strain-compensated quantum well structure.

SUMMARY OF THE INVENTION

Problems to be Solved by the Invention

Since various organic materials, water, and the like have a strong absorption band in a long-wavelength region of the near-infrared, development of a photodiode having responsivity in this wavelength region, for example, in a wavelength region up to about 3 μm, has been greatly desired. In order to form the above-described type II (InGaAs/GaAsSb) multiple quantum well structure on an InP substrate, a GaAsSb layer, which is likely to cause phase separation, must be grown without phase separation. Moreover, an absorption layer having the type II (InGaAs/GaAsSb) multiple quantum well structure in the above-described photodiode has a lower light-absorption efficiency as compared with a general absorption layer such as an InGaAs single layer. In order to improve the light-absorption efficiency, it is necessary to increase the number of pairs of InGaAs/GaAsSb. For example, 100 or more pairs of quantum wells are required in order to achieve a practically sufficient light-absorption efficiency.

Manufacturing of an InP-based photodiode has the following problem, in addition to the above-described problem unique to the multiple quantum well structure. That is, in a photodiode having an absorption layer on an InP substrate, a window layer comprising an InP-based material is provided as an uppermost epitaxial layer. When the epitaxial layer is located on the light incident side, the window layer comprising an InP-based material effectively acts to reduce dark current while preventing absorption of near-infrared light at the light incident side. Further, accumulation of technical knowledge for formation of a passivation layer on a surface of InP is greater than that for formation of a passivation layer on a surface of another crystal, for example, InGaAs. That is, the technique of forming a passivation layer on a surface of InP has been established, and therefore, dark current leakage at the surface can be easily reduced. For the above reasons, the InP window layer is located at the uppermost surface. That is, it is necessary to form a semiconductor layer containing phosphorus (P). Since the source of phosphorus varies depending on the crystal growth method employed, the safety of a phosphorus compound or the like attached to an inner wall of a growth chamber will be an important issue, as described later.

When a quantum well structure is formed by MOVPE, switching of growth between, for example, InGaAs and GaAsSb, which constitute quantum wells, is performed by switching source gases thereof. Accordingly, in MOVPE, unnecessary gas immediately before the switching remains, and thus interfaces each having a sharp composition change cannot be obtained if the number of pairs increases to about 50. It has been considered that it is difficult to form, by MOVPE, a multiple quantum well structure having more than 50 pairs while maintaining a good quality.

In Non-Patent Document 2, a type InGaAs/GaAsSb quantum well structure is formed by MOVPE. As sources for InGaAs, trimethylindium (TMIn), trimethylgallium (TMGa), and arsine ($AsH_3$) are used. On the other hand, as sources for GaAsSb, trimethylgallium (TMGa), tertiarybutylarsine (TBAs), and triethylantimony (TESb) are used. In this method, however, it is difficult to increase the number of pairs in the type II InGaAs/GaAsSb quantum well structure. Also in Non-Patent Literature 2, samples of multiple quantum well structures in which the number of pairs of quantum wells was varied in a range of not less than 10 but not greater than 20 were merely manufactured, and the quality evaluation was not sufficiently discussed. In manufacturing of a multiple quantum well structure, defect and roughness at a crystal growth surface is considered to be caused by local strain or non-periodical atomic bonding, which are induced by imperfect atomic ordering or the like during formation of a crystal growth interface using dissimilar materials. That is, the size of defect or roughness at the growth surface increases as the number of pairs in the multiple quantum well structure increases and thereby the number of interfaces increases. When the number of pairs in the quantum well structure is 20 or less, for example, the size of defect or roughness is reduced to less than about 1 μm, which does not cause a major problem in the flatness of the crystal surface. However, if the number of pairs is 50 or more, for example, the size of defect or roughness increases to about 10 μm, which generally causes a serious problem in the flatness of the crystal surface.

On the other hand, Patent Literature 1 is not directed to a multiple quantum well structure, but discloses only a single quantum well structure of GaInNAsSb (number of pairs=1). Accordingly, it is out of consideration to increase the number of pairs in the quantum well structure, for example, to increase the number of pairs to 50 or more. This is partly because a difference in lattice constant between GaInNAsSb constituting the quantum well structure and GaAs as a substrate is great. That is, the lattice mismatch of GaInNAsSb, which is defined by a formula, (lattice constant of GaInNAsSb−lattice constant of GaAs)/lattice constant of GaAs, is about 1.7%. When the lattice mismatch is about 1.7%, the number of pairs in the quantum well structure is only about 5 at most. If the number of pairs in the quantum well structure is increased to 50 or more, crystal defect occurs due to the difference in lattice constant and thus misfit dislocation occurs, which significantly degrades the crystalline quality. For the reason described above, a person with ordinary skill in the art has no opportunity to arrive at a multiple quantum well structure based on Patent Literature 1.

Meanwhile, as for manufacturing of a photodiode having a type II InGaAs/GaAsSb multiple quantum well structure grown by MOVPE, a photodiode in which a multiple quantum well structure has a satisfactory flatness as its surface state has not yet been obtained. Therefore, formation of an InP window layer as an uppermost epitaxial layer has never been examined before.

In contrast to MOVPE, molecular beam epitaxy (MBE) allows instant switching of molecular beams by means of shutters. Therefore, MBE allows automatic switching of valves under microcomputer control. Consequently, it has been considered that film deposition by MBE is almost inevitable for growth of a high-quality multiple quantum well structure having sharp interfaces.

If the problem regarding the crystal growth of a GaAsSb layer that is likely to cause phase separation is solely considered, a crystal growth method having a high non-equilibriumity is required in order to perform epitaxial growth while preventing such phase separation. Therefore, MBE, which is a crystal growth method having a high non-equilibriumity, is suitable. Actually, MBE is used for formation of a GaAsSb layer (Non-Patent Document 1).

However, MOVPE is a growth method having a high deposition efficiency. It is very beneficial industrially to grow a multiple quantum well structure having a large number of pairs by MOVPE.

Although MBE has an advantage in forming a multiple quantum well structure including GaAsSb, it is not easy to grow, by MBE, the above-described InP window layer while maintaining high industrial safety. The reason is as follows. Since MBE uses solid sources, solid phosphorous is used as a source of phosphorous (P) in the InP window layer. Hence, as described above, the solid phosphorous, which is a residual after deposition, is attached to the wall of the deposition chamber as the deposition progresses. The solid phosphorous has high ignitability, which leads to a high possibility of fire accident when the chamber is opened for material introduction or chamber maintenance. Therefore, measures for preventing such accident are required. In addition, if the source material of phosphorous is used, an exhaust gas abatement system for phosphorous is further required.

Under the above-described circumstances, it is a major object of the present invention to provide: a method for manufacturing a semiconductor device, by which a multiple quantum well structure having a large number of pairs can be efficiently grown while ensuring a good crystalline quality; and the semiconductor device. Further, it is another object of the present invention to provide: a method for forming an InP window layer having a good crystallinity, on a multiple quantum well structure having a large number of pairs; and a semiconductor device including an InP window layer having a good crystallinity.

Solution to the Problems

A method for manufacturing a semiconductor device of the present invention manufactures a group III-V compound semiconductor device. This manufacturing method includes a step of forming a multiple quantum well structure having 50 or more pairs of group III-V compound semiconductor quantum wells. In the multiple quantum well structure forming step, the multiple quantum well structure is formed by metal-organic vapor phase epitaxy using only metal-organic sources.

The metal-organic vapor phase epitaxy using only metal-organic sources is a growth method in which metal-organic sources composed of compounds of organic materials and metals are used as all sources for vapor phase epitaxy, and it is referred to as "all metal-organic source MOVPE".

In addition, "temperature" means a substrate surface temperature that is monitored by a pyrometer including an IR camera and an IR spectrometer. Accordingly, the substrate surface temperature is exactly a temperature at a surface of an epitaxial layer that is being grown on the substrate.

The inventors have discovered, as a result of thorough research, that a high-quality multiple quantum well structure having 50 or more pairs of III-V compound semiconductor quantum wells can be formed by all metal-organic source MOVPE. As for the mechanism thereof, the inventors basically consider as follows.

In the above-described method, crystal layers are grown on the substrate by all metal-organic source MOVPE. In all metal-organic source MOVPE, all the sources used are easy to decompose because the molecular weights of molecules thereof are high. A metal-organic gas, which is located so close to the substrate as to contact the substrate, is efficiently decomposed into a form required for crystal growth and contributes to the crystal growth, in contrast to ordinary MOVPE using inorganic sources as well. The present invention greatly depends on this point.

The above mechanism will be described in more detail below. After a first compound, which is a component of a quantum well pair, is grown to a predetermined thickness, supply of the source gas of the first compound is stopped by an electromagnetic valve while flowing a carrier gas (hydrogen) and performing evacuation using a vacuum pump. At this time, only the first compound is continuously grown by a slight amount on the substrate due to inertia. This slight growth is caused by the metal-organic gas that is almost in contact with the substrate and is located in a region where the temperature is close to the substrate temperature. Even in this case, the compound that is growing on the substrate fundamentally has the composition of the first compound.

Although all metal-organic source MOVPE is low in non-equilibriumity, this method allows a compound that is likely to cause phase separation to be grown without phase separation if the substrate temperature is low. By stopping supply of the source gas while flowing the carrier gas and evacuating the gas with the vacuum pump, the crystal growth of the first compound is stopped after the above-mentioned slight growth due to inertia.

Next, a source gas (metal-organic gas) for a second compound that pairs with the first compound is flowed while flowing the carrier gas. When the source gas reaches a sufficient concentration near the substrate, crystal growth of the second compound starts. After the second compound is grown to a predetermined thickness, the electromagnetic valve of the source gas of the second compound is turned off while flowing the carrier gas (hydrogen) and performing evacuation with the vacuum pump. At this time, only the second compound grows by a slight amount due to inertia. The slight growth is caused by the metal-organic gas that is almost in contact with the substrate and is located in a region where the temperature is close to the substrate temperature. Even in this case, the compound that is growing on the substrate fundamentally has the composition of the second compound. If a multiple quantum well structure is grown through the above-described steps by all metal-organic source MOVPE, a heterointerface having a sharp composition change can be obtained. The operations such as open/close of the electromagnetic valves and forced evacuation by the vacuum pump are all controlled by a computer and carried out automatically.

A major reason why the present invention can provide sharp heterointerfaces over 50 or more pairs of quantum wells is because the present invention uses all metal-organic source MOVPE, and therefore, the source gas that is located almost in contact with the substrate is completely decomposed and contributes to the crystal growth. In the conventional ordinary MOVPE, some of source gases for compounds to be formed are low in decomposition efficiency, and therefore, a great amount of source gases is required in order to achieve desired crystal growth. However, because of the low decomposition efficiency, the source gas located almost in contact with the substrate includes the undecomposed source gas and the gas of an intermediate product or the like in the middle of the decomposition. These gases are incorporated in the crystal growth of the compound and adversely affect the crystal growth, which makes it impossible to obtain a sharp heterointerface. However, in all metal-organic source MOVPE, the source gases are high in decomposition efficiency, and intermediate reaction products are not likely to occur in the middle of the decomposition. Therefore, the inventors have discovered that it can be expected that, in all metal-organic source MOVPE, the source gas near the substrate, which contributes to the crystal growth, does not include "residual source gas that inhibits sharp composition change".

Another major reason why the present invention can provide sharp heterointerfaces over 50 or more pairs of quantum wells is because the present invention uses all metal-organic source MOVPE as a source of As in InGaAs and GaAsSb which constitute a multiple quantum well structure in which the number of pairs exceeds 50. It is considered that, when forming the multiple quantum well structure, the source of As is not changed at the boundary (interface) of InGaAs and GaAsSb, and therefore, sharp interfaces can be formed in the quantum well structure. This effect becomes more prominent as the number of pairs in the quantum well structure increases, and realizes excellent characteristics in the multiple quantum well structure having a large number of pairs.

In summary, by optimizing the crystal growth condition in terms of the sources for crystal growth, a multiple quantum well structure having 50 or more pairs of quantum wells, which includes high-quality crystal layers and sharp composition interfaces, can be efficiently grown by all metal-organic source MOVPE. In addition, since all metal-organic source MOVPE does not use solid phosphorus (P) as a source when growing an InP window layer described later, this method is very advantageous in safety.

In the above-described multiple quantum well structure forming process, it is possible to form a multiple quantum well structure having 200 or more pairs of group III-V compound semiconductor quantum wells. Thereby, a photodiode whose responsivity is sufficiently at a practical level can be obtained. If the number of pairs is less than 200, light absorption is not sufficient, which makes it difficult to practically apply the photodiode to an imaging system or the like.

In the multiple quantum well structure forming process, it is possible to form a multiple quantum well structure having 700 or less pairs of group III-V compound semiconductor quantum wells. If the number of pairs of quantum wells is excessively increased, lattice defects are accumulated, which causes surface roughness of crystal of an uppermost layer such as a window layer, resulting in increased dark current. By limiting the number of pairs of quantum wells to 700 or less, a photodiode having sufficiently low dark current can be obtained.

In the present invention, a step of forming a layer including a group III-V compound semiconductor (a layer having no quantum well structure) is provided after the multiple quantum well structure forming step, and growth is performed, from the start of growth of the multiple quantum well structure to the end of growth of the layer including a group III-V compound semiconductor, in the same growth chamber by all metal-organic source MOVPE so that a step of forming a regrown interface is not included between the multiple quantum well structure forming step and the step of forming the layer including a group III-V compound semiconductor. According to this method, since the layers, from the multiple quantum well structure to the layer including a group III-V compound semiconductor, can be consistently formed by all metal-organic source MOVPE, no regrown interface is formed. Therefore, if a photodiode is formed, for example, it is possible to avoid dark current leakage or the like due to impurities at a regrown interface.

The regrown interface is an interface between a first crystal layer and a second crystal layer, which is formed when, after the first crystal layer is grown by a predetermined growth method, the first crystal layer is once exposed to the atmosphere, and then the second crystal layer is grown in contact with the first crystal layer by another growth method. Usually, high-concentration oxygen, carbon, and silicon are incorporated in the regrown interface as impurities.

Another layer may be disposed between the multiple quantum well structure and the layer including a group III-V compound semiconductor. The layer including a group III-V compound semiconductor may be disposed in contact with the multiple quantum well structure without disposing another layer between them. Specific examples will be described below.

The multiple quantum well structure may be a type II multiple quantum well structure which is composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8$, $0 < v \leq 0.2$) and $GaAs_{1-y}Sb_y$ ($0.36 \leq y \leq 0.62$). Thereby, a semiconductor device having a wavelength of 2 μm to 5 μm, which depends on its energy band gap, can be efficiently manufactured in large numbers while maintaining low impurity concentration and good crystallinity.

The semiconductor device is a photodiode, and the photodiode includes an absorption layer having a type II multiple quantum well structure which is composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8$, $0 < v \leq 0.2$) and $GaAs_{1-y}Sb_y$ ($0.36 \leq y \leq 0.62$). Thereby, a photodiode or the like, having responsivity in a wavelength region of 2 μm to 5 μm, can be efficiently manufactured in large numbers while maintaining good crystallinity.

The inventors have discovered that, in the multiple quantum well structure forming process, a high-quality multiple quantum well structure can be formed at a temperature not lower than 400° C. but not higher than 560° C. According to this method, crystal layers are grown on a substrate, at or near a predetermined temperature or in a predetermined temperature range, within the range of 400° C. to 560° C., by all metal-organic source MOVPE. When the multiple quantum well structure is formed at or near a predetermined temperature or in a predetermined temperature range, within the range of 400° C., to 560° C. since the decomposition efficiency of the source gas is high in all metal-organic source MOVPE, the metal-organic gas that is located almost in contact with the substrate is efficiency decomposed into a form required for the crystal growth and contributes to the growth of the crystal layers, and therefore, sharpness of composition at the heterointerface can be obtained. That is, it is possible to obtain a crystal growth surface, which is clean and excellent in flatness, of a multiple quantum well structure, and the multiple quantum well structure having excellent periodicity and crystallinity. When the multiple quantum well structure was formed in a temperature range lower than 400° C., the decomposition efficiency of the source gas was significantly lowered, and sharpness of composition at the heterointerface could not be obtained. Therefore, it was not possible to obtain a crystal growth surface, which was clean and excellent in flatness, of a multiple quantum well structure, and the multiple quantum well structure having excellent periodicity and crystallinity. Further, when the multiple quantum well structure was formed in a temperature range exceeding 560° C., phase separation occurred during crystal growth of GaAsSb. Therefore, it was impossible to obtain a crystal growth surface, which was clean and excellent in flatness, of a multiple quantum well structure, and the multiple quantum well structure having excellent periodicity and crystallinity.

A layer including an InP layer or an AlInAs layer may be formed as the layer including a group III-V compound semiconductor. Thereby, the semiconductor layers, from the multiple quantum well structure, are consistently formed in the same growth chamber, and therefore, a regrown interface containing a large amount of impurities is not formed, resulting in a semiconductor device having excellent characteristics.

The inventors have discovered that, particularly in the case of the InP layer, when a metal-organic source gas such as tertiarybutylphosphine was used as a source of phosphorus, the source gas was decomposed in the temperature range of not lower than 400° C. but not higher than 560° C. and contributed to the crystal growth. When the InP window layer was formed in a temperature range lower than 400° C., the decomposition efficiency of the source gas was significantly reduced, and the impurity concentration in the InP layer was increased. Thus, a high-quality InP window layer could not be obtained. Further, when the InP window layer was formed at a temperature exceeding 560° C., the crystal of the underlying multiple quantum well structure was damaged by heat, and the crystallinity thereof was degraded. The inventors have discovered that, by setting the growth temperature in the range of not lower than 400° C. but not higher than 560° C., a semiconductor device having a high-quality window layer could be formed without degrading the crystallinity of the multiple quantum well structure. In addition, the growth method of the present invention is reliable in terms of safety or the like because a solid source is not used as a source of P. Further, the growth method of the present invention has an advantage in growth efficiency over other growth methods, particularly, MBE. Furthermore, if the InP window layer is formed in a photodiode, a passivation layer can be easily formed on the InP surface, and therefore, dark current leakage can be easily inhibited.

In the above-described multiple quantum well structure forming process, the multiple quantum well structure may be formed using triethylgallium (TEGa) as a source of gallium (Ga). Thereby, a high-quality multiple quantum well structure can be efficiently manufactured in large numbers, while maintaining low impurity concentration and excellent crystallinity of the multiple quantum well structure.

In the above-described multiple quantum well structure forming process, the multiple quantum well structure may be formed using trimethylindium (TMIn) as a source of indium (In). Thereby, a high-quality multiple quantum well structure can be efficiently manufactured in large numbers, while maintaining excellent crystallinity.

In the above-described multiple quantum well structure forming process, the multiple quantum well structure may be formed using tertiarybutylarsine (TBAs) as a source of arsine (As). Thereby, a high-quality multiple quantum well structure can be efficiently manufactured in large numbers, while maintaining low impurity concentration and good crystallinity of the multiple quantum well structure.

In the above-described multiple quantum well structure forming process, the multiple quantum well structure may be formed using triethylantimony (TESb) as a source of antimony (Sb). Thereby, a high-quality multiple quantum well structure can be efficiently manufactured in large numbers, while maintaining low impurity concentration and good crystallinity of the multiple quantum well structure.

A semiconductor device of the present invention is manufactured by any of the above-described methods. Therefore, the semiconductor device is composed of semiconductor layers having good crystallinity and low impurity concentration, thereby realizing excellent characteristics.

The semiconductor device of the present invention is a group III-V compound semiconductor device. The semiconductor device includes: a group III-V compound semiconductor substrate; a group III-V compound semiconductor multiple quantum well structure located on the substrate; and a layer including a group III-V compound semiconductor (a layer having no quantum well structure), located on the multiple quantum well structure. The multiple quantum well structure includes 50 or more pairs of quantum wells, and no regrown interface is present between an upper surface of the multiple quantum well structure and a bottom surface of the layer including a group III-V compound semiconductor.

The above-described number of pairs can efficiently increase the absorption efficiency of the multiple quantum well structure. In addition, since no regrown interface is formed while having the layer including a group III-V compound semiconductor, it is possible to obtain a semiconductor device having less impurity elements, good crystallinity, and excellent characteristics.

In the semiconductor device, the regrown interface is identified when it satisfies either of the oxygen concentration of $1 \times 10^{17}$ cm$^{-3}$ or more or the carbon concentration of $1 \times 10^{17}$ cm$^{-3}$ or more. The oxygen concentration and the carbon concentration can be measured by secondary on mass spectrometry.

In the multiple quantum well structure, the number of pairs of quantum wells may be 200 or more. Thereby, the light-absorption ability, that is, the responsivity, can be increased to a practical level.

Further, in the multiple quantum well structure, the number of pairs of quantum wells may be 700 or less. If the number of pairs of quantum wells is excessively increased, lattice defects are accumulated, which causes surface roughness of crystal of an uppermost layer such as a window layer, resulting in increased dark current. By limiting the number of pairs of quantum wells to 700 or less, a photodiode having sufficiently low dark current can be obtained.

The multiple quantum well structure may be a type II multiple quantum well structure which is composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8$, $0 < v \leq 0.2$) and $GaAs_{1-y}Sb_y$ ($0.36 \leq y \leq 0.62$). Thereby, a semiconductor device having a wavelength of 2 μm to 5 μm, which depends on its energy band gap, can be efficiently manufactured in large numbers while maintaining low impurity concentration and good crystallinity.

The semiconductor device is a photodiode including the multiple quantum well structure as an absorption layer, and the multiple quantum well structure may be a type II multiple quantum well structure which is composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8$, $0 < v \leq 0.2$) and $GaAs_{1-y}Sb_y$ ($0.36 \leq y \leq 0.62$), and further, the layer including P may be an InP window layer. Thereby, a photodiode or the like, having good crystallinity, reduced dark current, and sufficient responsivity in a wavelength region of 2 μm to 5 μm, can be efficiently obtained in large numbers.

The above-described semiconductor device is a photodiode including the multiple quantum well structure as an absorption layer, and the responsivity of the photodiode to light of a wavelength of 2000 nm may be 0.5 A/W or more. Therefore, when the photodiode is used in an imaging system or a detection apparatus, practical high-quality images or highly-sensitivity detected data can be obtained.

The above-described semiconductor device is a photodiode including the multiple quantum well structure as an absorption layer, and a dark current density of dark current under a condition that a reverse bias voltage is 5 V, with respect to an area of an absorption part of the photodiode, may be 0.5 mA/cm$^2$ or less. Therefore, when the photodiode is used in an imaging system or a detection apparatus, practical high-quality images or high-sensitivity detected data can be obtained.

In the semiconductor layer of the multiple quantum well structure and the layer including a group III-V compound semiconductor, a lattice mismatch Δω to the substrate may be not less than −0.2% but not greater than 0.2%. Thereby, a semiconductor device having a low density of lattice defect, such as misfit dislocation, and good crystallinity can be obtained. As a result, when these layers are used in, for example, a photodiode, clear images with reduced dark current can be obtained.

Here, the lattice mismatch Δω is represented by Δω=Δa/a=(lattice constant of semiconductor layer−lattice constant of InP)/lattice constant of InP. In the case of the multiple quantum well structure, when the lattice mismatch of InGaAs is Δω$_1$ and the lattice mismatch of GaAsSb is Δω$_2$, the lattice mismatch Δω of the entire multiple quantum well structure is defined as follows: Δω={Σ(Δω$_1$×thickness of InGaAs layer+Δω$_2$×thickness of GaAsSb layer)}/{Σ(thickness of InGaAs layer+thickness of GaAsSb layer)}. The Σ is performed for each InGaAs layer and each GaAsSb layer.

The layer including a group III-V compound semiconductor may be a layer including an InP layer or an AlInAs layer. Thereby, it is possible to form a semiconductor device having high crystallinity, low impurity concentration, and excellent characteristics.

Particularly in the case of the InP layer, a multiple quantum well structure having good crystallinity can be obtained beneath the InP layer. Further, when the InP window layer is formed in a photodiode, a passivation layer can be easily formed on the InP surface and thereby dark current leakage can be easily inhibited.

An imaging system of the present invention includes a semiconductor device that is manufactured by any of the above-described semiconductor device manufacturing methods, or includes any of the above-described semiconductor devices. Therefore, good crystallinity is obtained and thereby dark current is reduced, which makes it possible to inexpensively obtain an imaging system providing clear and high-definition images.

Effects of the Invention

According to the semiconductor device manufacturing method of the present invention, a multiple quantum well structure having a large number of pairs can be efficiently grown while ensuring a good crystalline quality. Thus, it is possible to efficiently manufacture a photodiode, which includes an absorption layer of a type II multiple quantum well structure and an InP widow layer and has responsivity in a long-wavelength region of the near infrared, without causing regrown interfaces.

DESCRIPTION OF EMBODIMENTS

Best Mode for Carrying Out the Invention (Embodiment 1)

Figure 1:
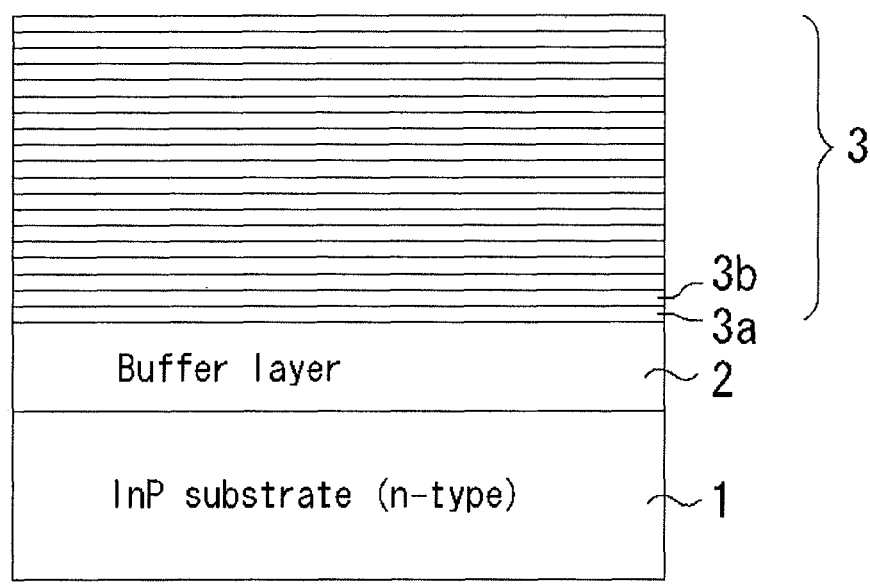
FIG. 1 is a cross-sectional view for explaining a method for manufacturing a multiple quantum well structure, according to Embodiment 1 of the present invention.

FIG. 1 is a cross-sectional view illustrating a multiple quantum well structure manufactured by a method for manufacturing a semiconductor device according to Embodiment 1 of the present invention. The multiple quantum well structure 3 is formed on an S-doped n-type InP substrate 1 via an InGaAs buffer layer 2. Each of pairs of quantum wells in the multiple quantum well structure 3 comprises GaAsSb 3a having a thickness of 5 nm and InGaAs 3b having a thickness of 5 nm. Both are non-doped. The GaAsSb 3a is formed in direct contact with the InGaAs buffer layer. In the present embodiment, the multiple quantum well structure 3 includes 250 pairs of quantum wells. The present embodiment is Characterized in that the multiple quantum well structure 3 including 250 pairs of quantum wells is formed by all metal-organic source MOVPE.

Figure 2:
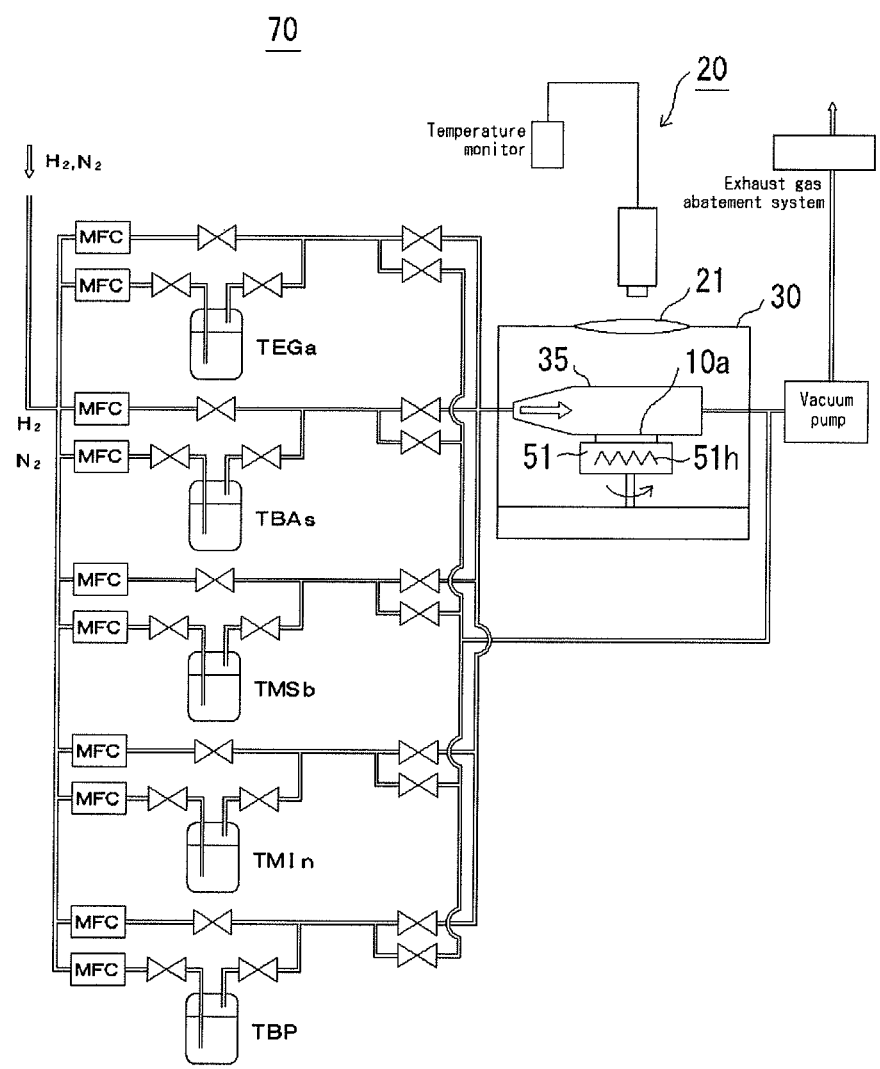
FIG. 2 is a view for explaining a deposition apparatus for manufacturing the multiple quantum well structure of FIG. 1.

FIG. 2 illustrates a piping system and the like of a deposition apparatus 70 for all metal-organic source MOVPE, by which the multiple quantum well structure 3 is formed. A quartz tube 35 is placed inside a reaction chamber 30, and source gases are introduced into the quartz tube 35. In the quartz tube 35, a substrate table 51 is placed rotatably and hermetically. The substrate table 51 is provided with a heater 51h for heating a substrate. The temperature at a surface of a wafer 10a during deposition is monitored by an infrared temperature monitor 20 through a window 21 provided at a ceiling of the reaction chamber 30. The monitored temperature is a temperature which is referred to as a temperature at which growth is performed, or a deposition temperature, or a substrate temperature. When it is described that a multiple quantum well structure is formed at a temperature not lower than 400° C. but not higher than 560° C. in the manufacturing method of the present invention, this temperature ranging from 400° C. to 560° C. is a temperature measured by the temperature monitor. Forced evacuation from the quartz tube 35 is performed by means of a vacuum pump.

Source gases are supplied through pipes connected to the quartz tube 35, all metal-organic source MOVPE is characterized in that all source gases are supplied in forms of metal-organic gases. Although source gases of dopants or the like are not shown in FIG. 2, dopants are also supplied in forms of metal-organic gases. The metal-organic gases are introduced in a constant temperature bath and kept at a constant temperature. Hydrogen ($H_2$) and nitrogen ($N_2$) are used as carrier gases. The metal-organic gases are carried by the carrier gases, and evacuated by the vacuum pump to be introduced into the quartz tube 35. The amount of the carrier gases is precisely controlled by mass flow controllers (MFCs). Many MFCs, electromagnetic valves, and the like are automatically controlled by a microcomputer.

A method for manufacturing the wafer 10 shown in FIG. 1 will be described. First, n-type InP buffer layer 2 having a thickness of 10 nm is epitaxially grown on an S-doped n-type InP substrate 1. Tetraethylsilane (TeESi) is used as an n-type dopant, trimethylindium (TMIn) and tertiarybutylphosphine (TBP) are used as source gases. The InP buffer layer 2 may be grown by using phosphine ($PH_3$) as an inorganic source. Even if the InP buffer layer 2 is grown at a growth temperature of about 600° C. or lower, the crystallinity of the underlying InP substrate is not degraded by the heating at about 600° C. However, when forming an InP window layer which will be described in Embodiment 2, since the multiple quantum well structure including GaAsSb is disposed under the InP window layer, the substrate temperature must be strictly maintained within a range of not lower than 400° C. but not higher than 560° C. The reason is as follows. If the wafer is heated to about 600° C., the GaAsSb is damaged by the heat, and its crystallinity is significantly degraded. In addition, if the InP window layer is formed at a temperature lower than 400° C., the source gas decomposition efficiency is significantly reduced, which causes an increase in the impurity concentration in the InP layer. Thus, a high-quality InP window layer cannot be obtained. Next, an n-doped InGaAs layer is grown to a thickness of 0.15 μm (150 nm) on the InP buffer layer 2. This InGaAs layer is also included in the buffer layer 2 in FIG. 1.

Next, a type II multiple quantum well structure 3 having InGaAs/GaAsSb as a pair of quantum well is formed. In the quantum well structure, preferably, the GaAsSb 3a is 5 nm thick, and the InGaAs 3b is 5 nm thick. In FIG. 1, 250 pairs of quantum wells are deposited to form the multiple quantum well structure 3. For deposition of the GaAsSb 3a, triethylgallium (TEGa), tertiarybutylarsine (TBAs), and trimethylantimony (TMSb) are used. For deposition of the InGaAs 3b, TEGa, TMIn, and TBAs can be used. All the source gases are organic-metal gases, and the molecular weight of each compound is high. Therefore, the source gases are completely decomposed at a relatively low temperature not lower than 400° C. but not higher than 560° C., thereby contributing to the crystal growth. The composition change at each interface of quantum well can be made sharp by forming the multiple quantum well structure 3 by all metal-organic source MOVPE.

As a source of gallium (Ga), triethylgallium (TEGa) or trimethylgallium (TMGa) may be used. Preferably, TEGa is used because TEGa is superior TMGa in reducing the impurity concentration in the crystal. Particularly, the concentration of carbon, which is an impurity in the quantum well layer, is $1\times10^{16}$ cm$^{-3}$ or more when TMGa is used, whereas, it is less than $1\times10^{16}$ cm$^{-3}$ when TEGa is used. As a source of indium (In), trimethylindium (TMIn) or triethylindium (TEIn) may be used. Preferably, TMIn is used because TMIn is superior to TEIn in controllability for In composition. As a source of arsenic (As), tertiarybutylarsine (TBAs) or trimethylarsenic (TMAs) may be used. Preferably, TBAs is used because TBAs is superior to TMAs in reducing the impurity concentration in the crystal. Particularly, the concentration of carbon, which is an impurity in the quantum well layer, is $1\times10^{16}$ cm$^{-3}$ or more when TMAs is used, whereas, it is less than $1\times10^{16}$ cm$^{-3}$ when TBAs is used. As a source of antimony (Sb), trimethylantimony (TMSb) or triethylantimony (TESb) may be used. Alternatively, triisopropylantimony (TIPSb) or trisdimethylaminoantimony (TDMASb) may be used. Preferably, TESb is used because TESb is superior to the other sources in reducing the impurity concentration in the crystal. Particularly, the concentration of carbon, which is an impurity in the quantum well layer, is $1\times10^{16}$ cm$^{-3}$ or more when TMSb, TIPSb, or TDMASb are used, whereas, it is less than $1\times10^{16}$ cm$^{-3}$ when TESb is used. Thus, a semiconductor device in which the multiple quantum well layer has low impurity concentration and good crystallinity can be obtained. As a result, if the semiconductor device is applied to, for example, a photodiode, a photodiode having reduced dark current and high responsivity can be obtained. Moreover, using the photodiode, an imaging system capable of taking clearer images can be realized.

Figure 3:
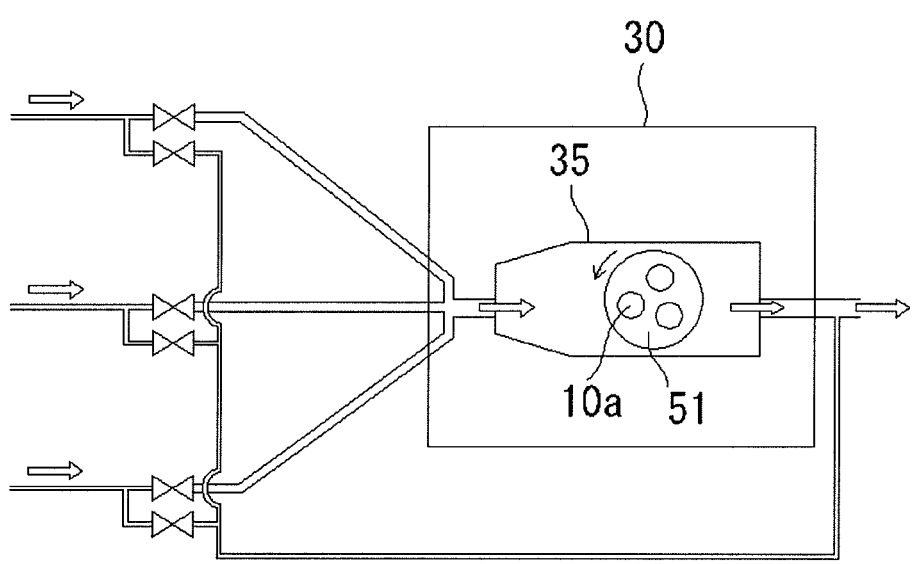
FIG. 3 is a partial plan view of the deposition apparatus of FIG. 2.

Next, a description will be given of how the source gases flow during formation of the multiple quantum well structure 3 by all metal-organic source MOVPE. FIG. 3 is a plan view illustrating the flow of source gases, in which the source gases are carried through pipes, introduced into the quartz tube 35, and evacuated. Although FIG. 3 shows the piping arrangement for only three kinds of source gases, even if dozen kinds of source gases are used, the fundamental structure that the source gases are controlled by open/close of electromagnetic valves is not changed.

Flow of each source gas into the quartz tube 35 is turned on/off according to open/close of the electromagnetic valve, with the flow rate of the source gas being controlled by the mass flow controller (MFC) shown in FIG. 2. Then, the source gases are forcibly evacuated from the quartz tube 35 by the vacuum pump. As shown in FIG. 3, the flow of the source gases is not interrupted but smoothly and automatically conducted. Accordingly, switching of compositions when forming the pairs of quantum wells is quickly performed.

Since the substrate table 51 rotates as shown in FIG. 3, the source gas temperature distribution does not have a directionality such that the source gas temperature is higher/lower at the source gas inlet side than at the source gas outlet side. Further, since the wafer 10a revolves on the substrate table 51, the source gas flow in the vicinity of the surface of the wafer 10a is in a turbulence state. Therefore, even the source gas near the surface of the wafer 10a, excluding the source gas contacting the wafer 10a, has a great velocity component in the direction of gas flow from the gas inlet side toward the gas outlet side. Accordingly, the heat, which flows from the substrate table 51 through the wafer 10a to the source gas, is mostly exhausted together with the exhaust gas, constantly. This causes a great temperature gradient or temperature gap in the vertical direction from the wafer 10a through its surface to the source gas space.

Further, in the embodiment of the present invention, the substrate temperature is set in a low temperature range of not lower than 400° C. but not higher than 560° C. When all metal-organic source MOVPE using metal-organic sources such as TBAs is performed at such a low substrate surface temperature, the decomposition efficiency of the source is high. Therefore, the source gases, which flow in a region very close to the wafer 10a and contribute to the growth of the multiple quantum well structure, are limited to those efficiently decomposed into a form required for the growth.

Figure 4A:
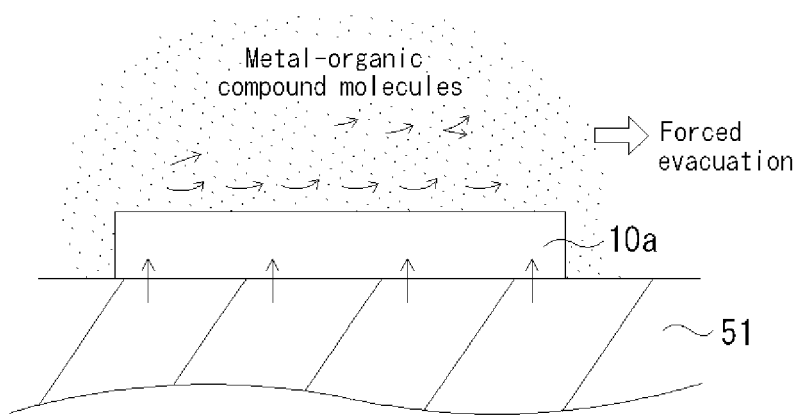
FIG. 4A is a view for explaining that a significant temperature drop occurs in an area from a wafer surface to the space due to flow of source gases in formation of a multiple quantum well structure by all metal-organic source MOVPE.
Figure 4B:
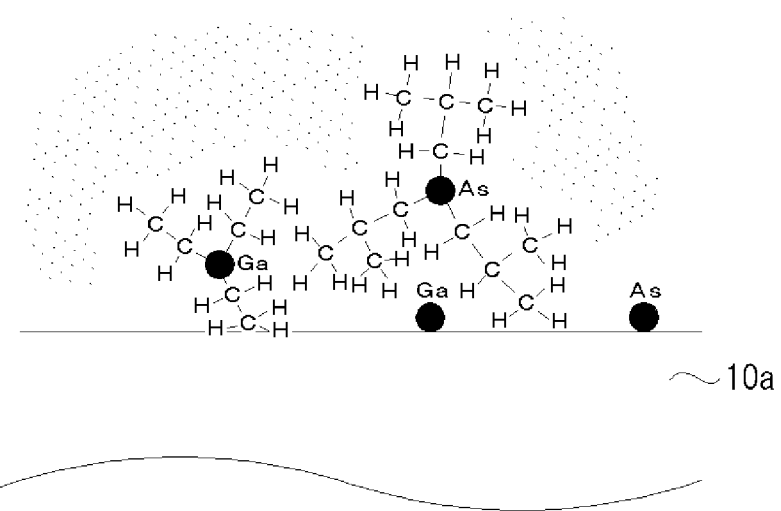
FIG. 4B, is a view for explaining molecules of metal-organic gases that contact the wafer surface in formation of a multiple quantum well structure by all metal-organic source MOVPE.

FIG. 4A is a diagram illustrating the flow of metal-organic molecules and the flow of temperature, and FIG. 4B is a schematic diagram illustrating the metal-organic molecules at the substrate surface. These figures are used for explaining that setting of the surface temperature is important in order to obtain sharp composition change at heterointerfaces in a multiple quantum well structure.

The substrate table 51 has heat conductivity. Although it is assumed that the surface of the wafer 10a is at the monitored temperature, a sudden temperature drop or a great temperature gap occurs as described above in the source gas space a little above the wafer surface. Therefore, in the case of using a source gas whose decomposition temperature is T1° C., the substrate surface temperature is set at (T1+α), and the α is determined in view of variation in temperature distribution and the like. Under the situation where a sudden temperature drop or a great temperature gap occurs from the surface of the wafer 10a to the source gas space, if large-size metal-organic molecules as shown in FIG. 4B flow against the wafer surface, the compound molecules that are decomposed and contribute to crystal growth are considered to be limited to those that contact the surface and those in a range equivalent to the thicknesses of a few metal-organic molecules from the surface. Accordingly, as shown in FIG. 4B, it is considered that the metal-organic molecules contacting the wafer surface and the metal-organic molecules located within die region equivalent to the thicknesses of a few metal-organic molecules from the wafer surface mainly contribute to crystal growth, while the metal-organic molecules located outside the region are hardly decomposed and are evacuated from the quartz tube 35. When the metal-organic molecules near the surface of the wafer 10a are decomposed and contribute to crystal growth, the metal-organic molecules located outside the region enter the region as supplemental molecules.

Taking the converse point of view, by setting the wafer surface temperature at a temperature slightly higher than the decomposition temperature of the metal-organic molecules, the range of the metal-organic molecules that can participate in crystal growth can be limited to the thin source gas layer on the surface of the wafer 10a.

As understood from the above description, when the source gases suited to the chemical compositions of the above-described pair are introduced by switching the gases using the electromagnetic valves while forcibly evacuating the gases using the vacuum pump, the crystal growth is performed such that, after a crystal of the previous chemical composition was grown with slight inertia, a crystal of the chemical composition, to which the source gases have been switched, can be grown without being affected by the previous source gases. As a result, the composition change at the heterointerface can be made sharp. Such a sharp composition change means that the previous source gas does not substantially remain in the quartz tube 35, and is caused by that the source gases that flow in a region very close to the wafer 10a and contribute to the growth of the multiple quantum well structure are limited those efficiently decomposed into the form required for the growth (factor 1). Specifically, as seen from FIG. 3, after one of the two layers in the quantum well is formed, the source gases for forming the other layer is introduced by opening/closing the electromagnetic valves while forcibly evacuating the gases with the vacuum pump. At this time, although some metal-organic molecules that participate in the crystal growth with slight inertia remain, the molecules of the one layer that may act as supplemental molecules are mostly evacuated and gone. As the wafer surface temperature is set closer to the decomposition temperature of the metal-organic molecules, the range of the metal-organic molecules that participate in the crystal growth (the range from the wafer surface) is reduced.

In the case of forming the multiple quantum well structure, if the multiple quantum well structure is grown at a temperature of about 600° C., phase separation occurs in the GaAsSb layers in the multiple quantum well structure, which makes it impossible to realize a clean and flat crystal growth surface of a multiple quantum well structure, and a multiple quantum well structure having excellent periodicity and crystallinity. Therefore, the growth temperature is set in the range of not lower than 400° C. but not higher than 560° C. (factor 2), and all metal-organic source MOVPE is adopted as a deposition method for this growth, in which metal-organic gases having high decomposition efficiency are used as all source gases (factor 3). The above-described factor 1 significantly depends on the factor 3.

(Embodiment 2)

Figure 5:
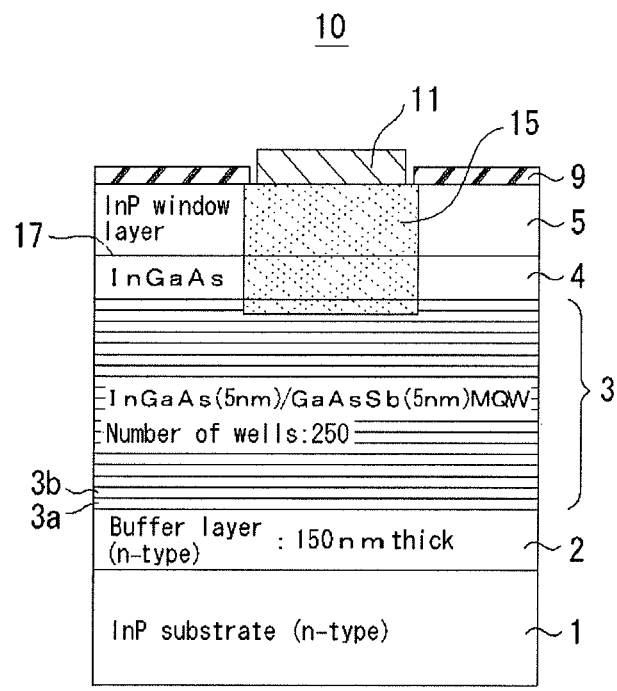
FIG. 5 is a cross-sectional view for explaining a photodiode as a semiconductor device according to Embodiment 2 of the present invention, wherein the oxygen concentration is $1 \times 10^{17}$ cm$^{-3}$ or less and the carbon concentration is $1 \times 10^{17}$ cm$^{-3}$ or less at an interface 17.

FIG. 5 is a cross-sectional diagram illustrating a semiconductor device according to Embodiment 2 of the present invention. The semiconductor device 10 is a light-receiving element such as a photodiode. The n-type InP substrate 1, the buffer layer 2, and the type II multiple quantum well structure 3 (InGaAs 3a/GaAsSb 3b) are identical to those in the structure of Embodiment 1 shown in FIG. 1. An InGaAs layer 4 having a function of adjusting the diffusive concentration distribution, which will be described later, is located on the type if multiple quantum well structure 3, and an InP window layer 5 is located on the InGaAs layer 4. A p-type dopant, Zn, is diffused into a predetermined region from the surface of the InP window layer 5 to provide a p-type region 15, and a p-n junction or a p-i junction is formed at an end of the p-type region 15. A reverse bias voltage is applied to the p-n junction or p-i junction to form a depletion layer which traps charges caused by photoelectric conversion, and thus the brightness of a pixel is made responsive to the amount of charges. The p-type region 15, or the p-n junction or p-i junction is a main part that constitutes the pixel. A p-side electrode 11 that is in ohmic-contact with the p-type region 15 is a pixel electrode, and the amount of charge is read, pixel by pixel, between the p-side electrode and an n-side electrode (not shown) that is connected to a common ground voltage. The surface of an window layer surrounding the p-type region 15 is covered with an insulating passivation layer 9.

It is a point that, after formation of the multiple quantum well structure, growth is continued in the same deposition chamber or quartz tube 35 by all metal-organic source MOVPE until the InP window layer 5 is formed. In other words, it is a point that no regrown interface is formed because the wafer 10a is not taken out from the deposition Chamber before formation of the InP window layer 5 to form the window layer 5 by another deposition method. That is, since the InGaAs layer 4 and the InP window layer 5 are continuously formed in the quartz tube 35, the interface 17 is not a regrown interface. Therefore, the oxygen concentration and the carbon concentration are both at a predetermined level or below, and no leakage current occurs at a line where the p-type region 15 and the interface 17 intersect.

In the present embodiment, as shown in FIG. 5, the 1.0 μm thick non-doped InGaAs layer 4 is formed on the multiple quantum well structure 3. After the formation of the InP window layer 5, when the p-type dopant, Zn, is introduced from the InP window layer 5 to reach the multiple quantum well structure 3 by a selective diffusion method, if the high-concentration Zn enters the multiple quantum well structure 3, the crystallinity of the multiple quantum well structure 3 is degraded. The InGaAs layer 4 is provided for adjusting the diffusion of the p-type dopant. Therefore, the InGaAs layer 4 is sometimes referred to as a diffusive-concentration-distribution-adjusting layer. It is preferred that, in the InGaAs layer 4, the Zn concentration is as high as $1\times10^{18}$ cm$^{-3}$ to $3\times10^{19}$ cm$^{-3}$ on the InP window layer side, whereas, the Zn concentration is rapidly decreased to $5\times10^{16}$ cm$^{-3}$ or lower on the multiple quantum well structure side. The insertion of the InGaAs layer 4 realizes such a Zn diffusive concentration distribution. The p-type dopant region 15 is formed by the above-described selective diffusion, and the p-n junction or the p-i junction is formed at the end of the p-type dopant region 15. Since the diffusive-concentration-distribution-adjusting layer is formed by using InGaAs, the electric resistance of the photodiode can be reduced even if the dopant concentration (Zn concentration) is low. The reduced electric resistance allows an increase in responsivity, thereby realizing a moving picture of a good image quality.

An undoped InP window layer is epitaxially grown on the InGaAs diffusive-concentration-distribution-adjusting layer 4, to a thickness of 0.8 μm, by all metal-organic source MOVPE, with the wafer 10a being placed in the same quartz tube 35. As described above, trimethylindium (TMIn) and tertiarybutylphosphine (TBP) are used as source gases. The use of the source gases allows the growth temperature of the InP window layer 5 to be not lower than 400° C. but not higher than 560° C., and more preferably, not higher than 535° C. As a result, the GaAsSb 3a in the multiple quantum well structure located under the InP window layer 5 is not damaged by heat, and thus the crystallinity of the multiple quantum wells is not degraded. When forming the InP window layer, since the multiple quantum well structure including GaAsSb is formed therebelow, the substrate temperature must be precisely maintained within a range of not lower than 400° C. and not higher than 560° C. The reason is as follows. If the wafer is heated to about 600° C., the GaAsSb is damaged by heat and the crystallinity thereof is significantly degraded. If the InP window layer is formed at a temperature lower than 400° C., the decomposition efficiency of the source gases is significantly reduced and the impurity concentration in the InP layer is increased, and thus a high-quality InP window layer cannot be obtained.

Figure 6:
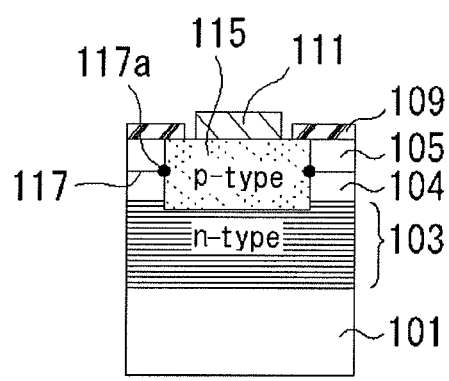
FIG. 6 is a cross-sectional view for explaining a photodiode including a multiple quantum well structure formed by MBE, and an InP window layer formed by MOVPE.

As described above, conventionally, a multiple quantum well structure has to be formed by MBE. However, growth of the InP window layer 5 by MBE requires a solid source as a source of phosphorus, which leads to a problem in terms of safety or the like. Further, there is still a room for improvement in view of manufacturing efficiency. FIG. 6 shows a photodiode 110 which is obtained by: forming a multiple quantum well structure 103 and an InGaAs layer 104 by MBE; exposing the wafer to the atmosphere; and forming an InP window layer 105 by MOVPE. Most part of the photodiode 110 is compositionally identical to the photodiode 10 shown in FIG. 5. That is, the photodiode 110 is composed of an InP substrate 101 and epitaxial layers of the multiple quantum well structure 103, the InGaAs diffusive-concentration-distribution-adjusting layer 104, and the InP window layer 105. A p-type region 115 that is a major part of a pixel, a p-side electrode 111 that constitutes a pixel electrode, and an insulating passivation layer 109 are identical to those of the photodiode shown in FIG. 5.

A different point is an interface 117 between the InGaAs layer 104 and the InP window layer 105. The interface 117 is a regrown interface once exposed to the atmosphere, and is identified when it satisfies either of the oxygen concentration of $1\times10^{17}$ cm$^{-3}$ or more or the carbon concentration of $1\times10^{17}$ cm$^{-3}$ or more. These concentrations can be confirmed by secondary ion mass spectrometry. The regrown interface 117 and the p-type region 115 form an intersection line 117a, and leakage current occurs at the intersection line 117a, which significantly degrades the image quality.

Further, if the InP window layer 105 is grown by simple MOVPE, since phosphine (PH$_3$) is used as a source of phosphorus, the decomposition temperature is high, Such a high decomposition temperature induces a thermal damage of the underlying GaAsSb, and thus the crystallinity of the multiple quantum well structure is degraded.

Figure 7:
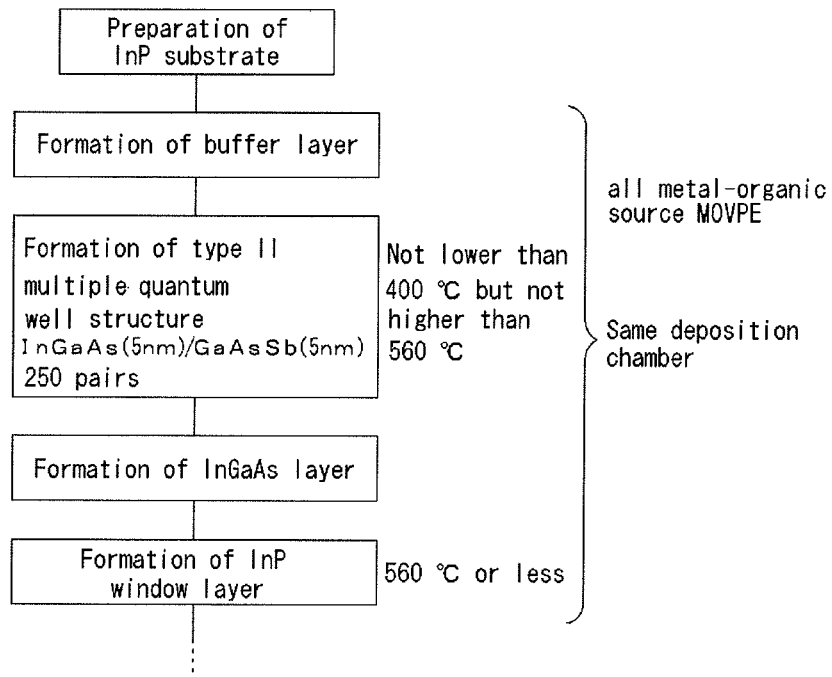
FIG. 7 is a flowchart of a manufacturing method for the photodiode of FIG. 5.

FIG. 7 is a flowchart of a method for manufacturing the photodiode 10 shown in FIG. 5. According to the manufacturing method, it is important to reduce the growth temperature (factor 2) by using only metal-organic gases as source gases (factor 3), and to grow the layers consistently in the same deposition chamber or quartz tube 35 until formation of the InP window layer 5 is completed so as to prevent a regrown interface (factor 4). Thus, a photodiode having less leakage current, good crystallinity, and responsivity in a wavelength region of 2 μm to 5 μm can be efficiently manufactured in large numbers.

In the present embodiment, the type II multiple quantum well structure is adopted. In a type I quantum well structure, when the quantum well structure is made to have responsivity in the near-infrared region, with a semiconductor layer having a small band gap energy being sandwiched by semiconductor layers having a large band gap energy, the upper-limit wavelength (cutoff wavelength) of the responsivity is determined by the band gap of the semiconductor layer having the small band gap energy. That is, transition of electrons or holes due to light is performed in the semiconductor layer having the small band gap energy (direct transition). In this structure, materials that can extend the cutoff wavelength to a longer wavelength region are considerably restricted in the group III-V compound semiconductors. In contrast, in the type II quantum well structure, when two different kinds of semiconductor layers are alternately disposed with a common Fermi energy, a difference in energy between the conduction band of the first semiconductor and the valence band of the second semiconductor determines the upper-limit wavelength (cutoff wavelength) of the responsivity. That is, transition of electrons or holes due to light is performed between the valence band of the second semiconductor and the conduction band of the first semiconductor (indirect transition). Therefore, by making the energy of the valence band of the second semiconductor higher than that of the valence band of the first semiconductor, and by making the energy of the conduction band of the first semiconductor lower than that of the conduction band of the second semiconductor, responsivity in a longer wavelength region can be easily realized as compared with the case using the direct transition in a single semiconductor.

EXAMPLES

Example 1

The photodiode shown in FIG. 5 (Example of the present invention) was manufactured by the methods according to Embodiments 1 and 2, and subjected to preliminary evaluation. The evaluation items and evaluation results are as follows. The photodiode shown in FIG. 6 was adopted as Comparative Example, in which MBE was used for formation of the multiple quantum well structure, MOVPE was used for formation of the InP window layer, and arsine ($AsH_3$) and phosphine ($PH_3$) were used as group V sources. The growth temperature of the InP window layer was 535° C. for Example of the present invention, and 600° C. for Comparative Example.

1. Surface Morphology of InP Window Layer

In Example of the present invention, a clean surface with excellent flatness was obtained. In contrast, in Comparative Example, the InP window layer had serious surface roughness.

2. X-Ray Diffraction of Multiple Quantum Well Structure

The periodicity of the type II multiple quantum well structure was evaluated by an X-ray diffraction method. The evaluation was performed based on the full width at half maximum of a predetermined peak in an X-ray diffraction pattern. In Example of the present invention, the full width at half maximum of the peak in the X ray diffraction pattern of the multiple quantum well structure was 80 sec. In Comparative Example, the full width at half maximum of the peak in the X ray diffraction pattern was 150 sec. Thus, it is discovered that the multiple quantum well structure of Example of the present invention is far superior in periodicity and crystallinity.

3. PL Emission Intensity

In Example of the present invention, an excellent PL emission intensity was obtained in a wavelength region of 2.4 μm. In contrast, evaluable PL emission was not obtained in Comparison Example.

Example 2

Examples A1 to A7 of the present invention as samples obtained by manufacturing the photodiode shown in FIG. 5 by the manufacturing methods of the present invention, and Comparative Examples B1 to B3 as samples obtained by manufacturing the photodiode by manufacturing methods different from the present invention, were prepared, and these samples were subjected to evaluation of crystallinity and evaluation of dark current in the photodiodes. The dark current was measured under conditions that the reverse bias voltage Vr was 5 V, and the absorption diameter was 100 μm.

(Example A1 of the present invention): a type II MQW absorption layer (temperature: 510° C.) and an InP window layer (temperature: 510° C.) grown by all metal-organic source MOVPE (Example A2 of the present invention): a type II MQW absorption layer (temperature: 380° C.) and an InP window layer (temperature: 510° C.) grown by all metal-organic source MOVPE (Example A3 of the present invention): a type II MQW absorption layer (temperature: 400° C.) and an InP window layer (temperature: 510° C.) grown by all metal-organic source MOVPE (Example A4 of the present invention): a type II MQW absorption layer (temperature: 450° C.) and an InP window layer (temperature: 510° C.) grown by all metal-organic source MOVPE (Example A5 of the present invention): a type II MQW absorption layer (temperature: 535° C.) and an InP window layer (temperature: 510° C.) grown by all metal-organic source MOVPE (Example A6 of the present invention): a type II MQW absorption layer (temperature: 560° C.) and an InP window layer (temperature: 510° C.) grown by all metal-organic source MOVPE (Example A7 of the present invention): a type II MQW absorption layer (temperature: 580° C.) and an InP window layer (temperature: 510° C.) grown by all metal-organic source MOVPE In Examples A1 to A7 of the present invention, when the type II (InGaAs/GaAsSb) MQWs were grown by all metal-organic source MOVPE, the growth temperature was varied in the range of 380° C. to 580° C. The other conditions were the same.

(Comparative Example B1: Method of Non-Patent Literature 1): a type II MQW absorption layer grown by MBE (temperature: 400° C.), and an InP window layer grown by ordinary MOVPE (temperature: 600° C.)

(Comparative Example B2: Method of Non-Patent Literature 2): a type II MQW absorption layer grown by ordinary MOVPE (temperature: 510° C.), and an InP window layer grown by all metal-organic source MOVPE (temperature: 510° C.)

(Comparative Example B3): a type II MQW absorption layer grown by ordinary MOVPE (temperature: 600° C.), and an InP window layer grown by all metal-organic source MOVPE (temperature: 510° C.)

In Comparative Examples, the type II (InGaAs/GaAsSb) MQWs were grown by MBE (Comparative Example B1) and ordinary MOVPE (Comparative Examples B1 and B2).

Table 1 and Table 2 show the manufacturing conditions for the above-described samples and the evaluation results.

TABLE 1

| | | Sample | | | | |
|---|---|---|---|---|---|---|
| | Item | Comparative example B1 | comparative example B2 | comparative example B3 | Example of present invention A1 | Example of present invention A2 |
| Crystal growth condition | growth of MQW structure | MBE | Ordinary MOVPE | Ordinary MOVPE | All metal-organic source MOVPE | All metal-organic source MOVPE |
| | Source for growth of MQW structure | Metal | $AsH_3$ for InGaAs, TBAs for GaAsSb | $AsH_3$ for InGaAs, TBAs for GaAsSb | Only TBAs as source of As (only metal-organic sources) | Only TBAs as source of As (only metal-organic sources) |
| | Growth temperature of MQW structure | 400° C. | 510° C. | 600° C. | 510° C. | 380° C. |

TABLE 1-continued

| | Item | Comparative example B1 | comparative example B2 | comparative example B3 | Example of present invention A1 | Example of present invention A2 |
|---|---|---|---|---|---|---|
| | Growth InP window layer | Ordinary MOVPE | All metal-oranic source MOVPE | All metal-organic source MOVPE | All metal-organic source MOVPE | All metal-organic source MOVPE |
| | Source for growth of InP window layer | $PH_3$ as source of P | TBP as source of P (only metal-organic sources) | TBP as source of P (only metal-organic sources) | TBP as source of P (only metal-organic sources) | TBP as source of P (only metal-organic sources) |
| | Growth temperature of InP window layer | 600° C. | 510° C. | 510° C. | 510° C. | 510° C. |
| Evaluation | Surface morphology of InP window layer | Severe surface roughness occurred | Severe surface roughness occurred | Severe surface roughness occurred | Clean surface with excellent flatness | Severe surface roughness occurred |
| | X-ray diffraction of MQW structure | Full width at half maximum of peak, 150 sec | Full width at half maximum of peak, 150 sec | Full width at half maximum of peak, 170 sec | Full width at half maximum of peak, 80 sec | Full width at half maximum of peak, 125 sec |
| | PL intensity | No emission at wavelength of 2.4 μm | No emission at wavelength of 2.4 μm | No emission at wavelength of 2.4 μm | Exellent emission at wavelength of 2.4 μm | No emission at wavelength of 2.4 μm |
| | Dark current of photodiode 100 μm diameter Vr = 5V | 5 μA Dark current failure | 4 μA Dark current failure | 10 μA Dark current failure | 400 nA Excellent characteristics | 5 μA Dark current failure |

TABLE 2

| | Item | Example of present invention A3 | Example of present invention A4 | Example of present invention A5 | Example of present invention A6 | Example of present invention A7 |
|---|---|---|---|---|---|---|
| Crystal Growth condition | Growth of MQW Structure Source for growth of MQW structure | All metal-organic source MOVPE Only TBAs as source of As (only metal-organic sources) | All metal-organic source MOVPE Only TBAs as source of As (only metal-organic sources) | All metal-organic source MOVPE Only TBAs as source of As (only metal-organic sources) | All metal-organic source MOVPE Only TBAs as source of As (only metal-organic sources) | All metal-organic source MOVPE Only TBAs as source of As (only metal-organic sources) |
| | Growth temperature of MQW structure | 400° C. | 450° C. | 535° C. | 560° C. | 580° C. |
| | Growth of InP window layer Source for growth of InP window layer | All metal-organic source MOVPE TBP as source of P (only metal-organic sources) | All metal-organic source MOVPE TBP as source of P (only metal-organic sources) | All metal organic source MOVPE TBP as source of P (only metal-organic sources) | All metal-organic source MOVPE TBP as source of P (only metal-organic sources) | All metal-organic source MOVPE TBP as source of P (only metal-organic sources) |
| | Growth temperature of InP window layer | 510° C. | 510° C. | 510° C. | 510° C. | 510° C. |

TABLE 2-continued

| | | Sample | | | | |
|---|---|---|---|---|---|---|
| | Item | Example of present invention A3 | Example of present invention A4 | Example of present invention A5 | Example of present invention A6 | Example of present invention A7 |
| Evaluation | Surface morphology of InP window layer | Clean surface with excellent flatness | Clean surface with excellent flatness | Clean surface with excellent flatness | Clean surface with excellent flatness | Severe surface roughness occurred |
| | X-ray diffraction of MQW structure | Full width at half maximum of peak, 55 sec | Full width at half maximum of peak, 55 sec | Full width at half maximum of peak, 85 sec | Full width at half maximum of peak, 95 sec | Full width at half maximum of peak, 150 sec |
| | PL intensity | Excellent emission at wavelength of 2.4 μm | Excellent emission at wavelength of 2.4 μm | Excellent emission at wavelength of 2.4 μm | Excellent emission at wavelength of 2.4 μm | No emission at wavelength of 2.4 μm |
| | Dark current of photodiode, 100 μm diameter Vr = 5V | 900 nA Excellent characteristics | 700 nA Excellent charactersitics | 400 nA Excellent characteristics | 800 nA Excellent characteristics | 8 μA Dark current failure |

According to Table 1, in Comparative Examples B1 to B3, the full width at half maximum of the X-ray diffraction peak in the MQW was great, like 150 sec (Comparative Example B1), 150 sec (Comparative Example B2), and 170 sec (Comparative Example B3), which results in poor crystallinity. Further, in Comparative Examples B1 to B3, PL emission at a wavelength of 2.4 μm was obtained. As for the surface morphology of the InP window layer, serious surface roughness occurred in Comparative Examples B1 to B3. The dark current in the photodiode was 5 μA in Comparative Example B1, and 4 μA in Comparative Example B2. As for the surface morphology of the InP window layer, if many defects and irregularities as large as 10 μm or more were confirmed, it was determined that "surface roughness occurred". If defects and irregularities of the above size were hardly found, it was determined that "clean surface with excellent flatness was obtained".

On the other hand, as shown in Table 1 and Table 2, in Examples A1 to A7 of the present invention, when the MQW growth temperature was extremely low, like 380° C. (Example A2), or extremely high, like 580° C. (Example A7), the full width at half maximum of the X-ray diffraction peak was great, like 125 sec and 150 sec, respectively. No PL emission occurred in Examples A2 and A7. In Examples A1, and A3 to A6, the full width at half maximum of the X-ray diffraction peak was small, like 80 sec, and 55 sec to 95 sec, respectively. Thus, good crystallinity was obtained, and PL, emission occurred. As for the surface morphology of the InP window layer, a clean surface with excellent flatness was obtained in Examples other than Examples A2 and A7. Moreover, in Examples other than Examples A2 and A7, the dark current was low, like 0.4 μA (Example A1), 0.9 μA (Example A3), 0.7 μA (Example A4), 0.4 μA (Example A5), and 0.8 μA (Example A6), and thus excellent dark current characteristics were obtained.

According to the result of Example 2, since the type II (InGaAs/GaAsSb) MQW was grown at a temperature in a range of 400° C., to 560° C. by all metal-organic source MOVPE according to the manufacturing method of the present invention, good crystallinity was obtained, and the surface of the InP window layer was excellent in flatness, resulting in reduced dark current. Even by the manufacturing method (crystal growth by all metal-organic source MOVPE) in the broadest scope of the present invention, a satisfactory result could not be obtained when the growth was performed at a temperature outside the range of 400° C. to 560° C. Further, like Comparative Examples B1 to B3, when the type II (InGaAs/GaAsSb) MQW was grown without using all metal-organic source MOVPE, degradation of crystallinity and consequent degradation of surface morphology of the InP window layer were confirmed.

Example 3

In Example A1 of the present invention in Example 2, the number of pairs of quantum wells was varied within a range of 50 to 1000. That is, in the structure of the photodiode shown in FIG. 5, the number of pairs of quantum wells was varied. The other growth conditions were the same as those for Example A1.

(Example A1-1 of the present invention): a type II MQW absorption layer (number of pairs: 50 pairs) grown by all metal-organic source MOVPE
(Example A1-2 of the present invention): a type II MQW absorption layer (number of pairs: 150 pairs) grown by all metal-organic source MOVPE
(Example A1-3 of the present invention): a type II MQW absorption layer (number of pairs: 250 pairs) grown by all metal-organic source MOVPE
(Example A1-4 of the present invention): a type II MQW absorption layer (number of pairs: 350 pairs) grown by all metal-organic source MOVPE
(Example A1-5 of the present invention): a type II MQW absorption layer (number of pairs: 450 pairs) grown by all metal-organic source MOVPE
(Example A1-6 of the present invention): a type II MQW absorption layer (number of pairs: 700 pairs) grown by all metal-organic source MOVPE
(Example A1-7 of the present invention): a type II MQW absorption layer (number of pairs: 850 pairs) grown by all metal-organic source MOVPE
(Example A1-8 of the present invention): a type II MQW absorption layer (number of pairs: 1000 pairs) grown by all metal-organic source MOVPE Examples A1-1 to A1-8 of the present invention were subjected to evaluation of dark current and responsivity of the photodiode. The dark current was measured under the conditions the reverse bias voltage Vr was 5 V, and the absorption diameter was 100 μm. The responsivity to light having a wavelength of 2000 nm was measured under conditions that the reverse bias voltage Vr was 5 V, and the absorption diameter was 1 mm. The evaluation result is shown on Table 3.

TABLE 3

| | | Example of present invention A1-1 | Example of present invention A1-2 | Example of present invention A1-3 | Example of present invention A1-4 | Example of present invention A1-5 | Example of present invention A1-6 | Example of present invention A1-7 | Example of present invention A1-8 |
|---|---|---|---|---|---|---|---|---|---|
| Structure | Number of pairs | 50 | 150 | 250 | 350 | 450 | 700 | 850 | 1000 |
| Evaluation | Surface morphology of InP window layer | Clean surface with excellent flatness | Clean surface with excellent flatness | Clean surface with excellent flatness | Clean surface with excellent flatness | Clean surface with excellent flatness | Clean surface with excellent flatness | Severe surface roughness occurred | Severe surface roughness occurred |
| | Dark current of photodiode, 100 μm diameter Vr = 5 V | 300 nA Excellent characteristics | 400 nA Excellent characteristics | 400 nA Excellent characteristics | 400 nA Excellent characteristics | 500 nA Excellent characteristics | 600 nA Excellent characteristics | 2 μA Dark current failure | 5 μA Dark current failure |
| | Responsivity of photodiode, 1 mm diameter Vr = 5 V λ = 2000 nm | 0.1 A/W | 0.3 A/W | 0.6 A/W | 0.65 A/W | 0.75 A/W | 0.75 A/W | 0.7 A/W | 0.6 A/W |

In Examples A1-1 to A1-6 of the present invention, the surface of the InP window layer was clean and excellent in flatness. The dark current of the photodiode was reduced to 300 nA to 600 nA, and thus excellent dark current characteristics were obtained. In Examples A1-7 and A1-8 of the present invention, surface roughness occurred in the InP window layer. The dark current of the photodiode was high, like 2 μA (Example A1-7) and 5 μA (Example A1-8), resulting in dark current failure.

On the other hand, in Examples A1-1 to A1-6 of the present invention, the responsivity increased from 0.1 A/W to 0.75 A/W as the number of pairs was increased from 50 to 700. In Examples A1-7 and A1-8 of the present invention, the responsivity was 0.7 A/W and 0.6 A/W, respectively.

Figure 8:
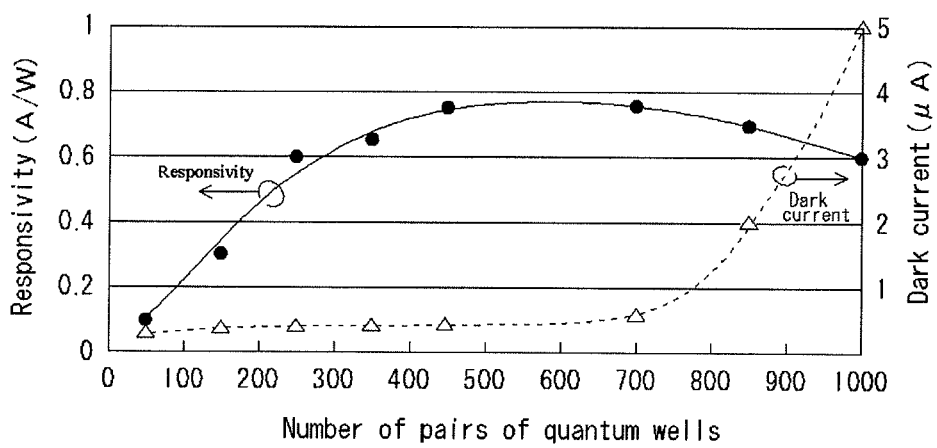
FIG. 8 is a graph illustrating the relation between the responsivity and the dark current, and the number of pairs of quantum wells, according to Example 3.

The relation between the responsivity and the dark current, and the number of quantum well pairs is shown in FIG. 8. When the number of pairs is 850 or more, the responsivity is high, but the dark current increases. There is a range of the number of pairs, by which both the responsivity and the dark current are brought to their practical levels.

Photodiode arrays including the photodiodes having the structures corresponding to Examples A1-1 to A1-8 of the present invention were manufactured, and imaging systems were manufactured using the respective photodiode arrays. Only in the cases of using the photodiode arrays corresponding to Examples A1-3 to A1-6, clearer images were successfully taken by setting the ambient temperature of the imaging systems to 0° C. or lower by using a cooling mechanism. On the other hand, in the cases of using the photodiodes corresponding to Examples A1-1, A1-2. A1-7, and A1-8, clear images could not be obtained although the ambient temperature of the imaging systems was set to 0° C. or lower by using a cooling mechanism. The detailed data will be described in Example 4 below.

Example 4

In Examples A1-3, A1-4, and A1-5 of the present invention in Example 3, during formation of the type II multiple quantum well structure 3 having InGaAs/GaAsSb as a quantum well pair, the sources used for the formation were varied. That is, in the structure of the photodiode shown in FIG. 5, the sources used for formation of the quantum wells were varied. The manufactured photodiodes are identical in structure.

(Example A1-3-1 of the present invention): a type II MQW absorption layer (number of pairs: 250 used sources: TEGa, TMIn, TBAs, TMSb) grown by all metal-organic source MOVPE (Example A1-3-2 of the present invention): a type II MQW absorption layer (number of pairs: 250; used sources: TEGa, TMIn, TBAs, TESb) grown by all metal-organic source MOVPE (Example A1-3-3 of the present invention): a type II MQW absorption layer (number of pairs: 250; used sources: TEGa, TMIn, TMAs, TESb) grown by all metal-organic source MOVPE (Example A1-3-4 of the present invention): a type II MQW absorption layer (number of pairs: 250; used sources: TEGa, TEIn, TBAs, TESb) grown by all metal-organic source MOVPE (Example A1-3-5 of the present invention): a type II MQW absorption layer (number of pairs: 250; used sources: TMGa, TMIn, TBAs, TESb) grown by all metal-organic source MOVPE (Example A1-4-1 of the present invention); a type II MQW absorption layer (number of pairs: 350; used sources: TEGa, TMIn, TBAs, TMSb) grown by all metal-organic source MOVPE (Example A1-4-2 of the present invention): a type II MQW absorption layer (number of pairs: 350; used sources: TEGa, TMIn, TBAs, TESb) grown by all metal-organic source MOVPE (Example A1-5-1 of the present invention): a type II MQW absorption layer (number of pairs: 450; used sources: TEGa, TMIn, TBAs, TMSb) grown by all metal-organic source MOVPE (Example A1-5-2 of the present invention): a type II MQW absorption layer (number of pairs: 450; used sources: TEGa, TMIn, TBAs, TESb) grown by all metal-organic source MOVPE Photodiode arrays were manufactured using Examples A1-3-1, A1-3-2, A1-3-3, A1-3-4, A1-3-5, A1-4-1, A1-4-2, A1-5-1, and A1-5-2 of the present invention under the same conditions, and imaging systems including the respective photodiode arrays were manufactured. Then, the imaging states of the respective imaging systems were evaluated. In each photodiode array, 320×256 photodiodes (pixels) were arranged, and thus each imaging system had about 80000 pixels in total. The dark current was measured under conditions that the reverse bias voltage Vr was 5 V, and the absorption diameter was 100 μm. The evaluation results are shown in Table 4.

in the cases of using the photodiode arrays corresponding to Examples A1-3-1 and A1-4-2 as samples in which the dark current density of the photodiode is 0.5 mA/cm² or less, clear

TABLE 4

| | | Example of present invention A1-3-1 | Example of present invention A1-3-2 | Example of present invention A1-3-3 | Example of present invention A1-3-4 | Example of present invention A1-3-5 | Example of present invention A1-4-1 | Example of present invention A1-4-2 | Example of present invention A1-5-1 | Example of present invention A1-5-2 |
|---|---|---|---|---|---|---|---|---|---|---|
| | Source | TEGa TMIn TBAs TMSb | TEGa TMIn TBAs TBSb | TEGa TMIn TBAs TMSb | TEGa TEIn TBAs TESb | TMGa TMIn TBAs TESb | TEGa TMIn TBAs TMSb | TEGa TMIn TBAs TESb | TEGa TMIn TBAs TMSb | TEGa TMIn TBAs TESb |
| Structure | Number of pairs | 250 | 250 | 250 | 250 | 250 | 350 | 350 | 450 | 450 |
| Evaluation | Surface morphology of InP window layer | Clean surface with excellent flatness | Clean surface with excellent flatness | Clean surface with excellent flatness | Severe surface roughness occurred | Clean surface with excellent flatness | Clean surface with excellent flatness | Clean surface with excellent flatness | Clean surface with excellent flatness | Clean surface with excellent flatness |
| | Dark current of photodiode, 100 μm diameter Vr = 5V | 400 nA | 40 nA | 5 μA | 3 μA | 5 μA | 400 nA | 40 nA | 500 nA | 50 nA |
| | Dark current density of photodiode Vr = 5V | 5 mA/cm² | 0.5 mA/cm² | 60 mA/cm² | 40 mA/cm² | 60 mA/cm² | 5 mA/cm² | 0.5 A/cm² | 6 mA/cm² | 0.6 mA/cm² |
| | Responsivity of photodiode, 1 mm diameter Vr = 5V λ = 2000 nm | 0.6 A/W | 0.75 A/W | 0.3 A/W | 0.1 A/W | 0.2 A/W | 0.65 A/W | 0.8 A/W | 0.75 A/W | 0.9 A/W |
| | Imaging status | Successful imaging (cooling mechanism needed) | Successful imaging (cooling mechanism not needed) | Imaging failed | Imaging failed | Imaging failed | Successful imaging (cooling mechanism needed) | Successful imaging (cooling mechanism not needed) | Successful imaging (cooling mechanism needed) | Successful imaging (cooling mechanism needed) |

In Example A1-3-3 as a sample using TMAs as a source of As, Example A1-3-4 as a sample using TEIn as a source of In, and Example A1-3-5 as a sample using TMGa as a source of Ga, the dark current of each manufactured photodiode, which was measured under the condition that the absorption diameter was 100 μm, was 3 μA to 5 μA. Thus, the dark current was increased and the characteristics were deteriorated as compared with Example A1-3-2. On the other hand, in Example A1-3-3 as a sample using TMAs as a source of As, Example A1-3-4 as a sample using TEIn as a source of In, and Example A1-3-5 as a sample using TMGa as a source of Ga, the responsivity was 0.1 A/W to 0.3 A/W. Thus, the responsivity was lowered and the characteristics were deteriorated as compared with Example A1-3-2.

In Examples A1-3-2, A1-4-2, and A1-5-2 as samples each using TESb as a source of Sb, the dark current of each manufactured photodiode, which was measured under the condition that the absorption diameter was 100 μm, was 40 nA to 50 nA, and thus the dark current was reduced and excellent dark current characteristics were obtained as compared with Examples A1-3-1, A1-4-1, and A1-5-1 as samples each using TMSb as a source of Sb. On the other hand, in Examples A1-3-2, A1-4-2, and A1-5-2 as samples each using TESb as a source of Sb, the responsivity was 0.75 A/W to 0.9 A/W. Thus, the responsivity was increased as compared with Examples A1-3-1, A1-4-1, and A1-5-1 as samples each using TMSb as a source of Sb.

Imaging systems were manufactured using the photodiode arrays manufactured using Examples A1-3-1, A1-3-2, A1-3-3, A1-3-4, A1-3-5, A1-4-1, A1-4-2, A1-5-1, and A1-5-2. Only images were successfully obtained without using a cooling mechanism. That is, only in the cases of using the photodiode arrays corresponding to Examples A1-3-1 and A1-4-2 of the present invention, in which the dark current density of the photodiode is 0.5 mA/cm² or less, clear images were successfully obtained even in a more practical temperature range in which the ambient temperature of the imaging system is, for example, not lower than 0° C. but not higher than 40° C.

Other Embodiments

Although only photodiodes have been described in the embodiments and Examples of the present invention, a semiconductor device manufactured by the manufacturing method of the present invention and a semiconductor device including the constituent elements of the present invention are not restricted to photodiodes, but are applicable to light-emitting devices (semiconductor lasers) and the like. Elements having functions and purposes other than those mentioned above are also within the scope of the present invention.

Embodiments and Examples of the present invention have been described above. However, the embodiments and the examples of the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

INDUSTRIAL APPLICABILITY

According to a semiconductor device manufacturing method of the present invention, a multiple quantum well structure having a large number of pairs can be efficiently grown while ensuring a good crystalline quality. Thereby, an InP-based photodiode, which includes an absorption layer of a type II multiple quantum well structure and an InP window layer and has responsivity in a long-wavelength range of the near infrared, can be manufactured such that all epitaxial growth layers are grown consistently in the same deposition chamber by all metal-organic source MOVPE. Therefore, a high-quality photodiode having no regrown interface can be obtained. In addition, both an increase in efficiency unique to the deposition method and an increase in efficiency due to continuous growth can be achieved. Moreover, since no solid source is used as a source of phosphorus, anxiety about safety is eliminated.

DESCRIPTION OF THE REFERENCE CHARACTERS

1 ... InP substrate, 2 ... buffer layer (InP and/or InGaAs), 3 ... type II multiple quantum well structure, 3a ... GaAsSb layer, 3b ... InGaAs layer, 4 ... InGaAs layer (diffusive-concentration-distribution-adjusting layer), 5 ... InP window layer, 9 ... insulating passivation layer, 10 ... product (interim product) including the multiple quantum well structure, 10a ... wafer (interim product), 11 ... p-side electrode (pixel electrode), 15 ... p-type dopant region, 17 ... interface between the InGaAs layer and the InP window layer, 20 ... infrared temperature monitor, 21 ... window of a reaction Chamber, 30 ... reaction chamber, 35 ... quartz tube, 51 ... substrate table, 51h ... heater, 70 ... deposition apparatus for all metal-organic source MOVPE

The invention claimed is:

1. A group III-V compound semiconductor device, comprising:
    a group III-V compound semiconductor substrate;
    a group III-V compound semiconductor multiple quantum well structure located on the substrate; and
    a layer including a group III-V compound semiconductor, located on the multiple quantum well structure via an interface, wherein
    the multiple quantum well structure includes 200 or more and 700 or less pairs of quantum wells,
    the layer including a group III-V compound semiconductor is a layer including an InP layer; and
    an oxygen concentration and a carbon concentration are less than $1 \times 10^{17} \text{cm}^{-3}$ at the interface between an upper surface of the multiple quantum well structure and a bottom surface of the layer including a group III-V compound semiconductor.

2. The semiconductor device according to claim 1, wherein the multiple quantum well structure is a type II multiple quantum well structure which is composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8, 0 < v \leq 0.2$) and $GaAs_{1-y}Sb_y$ ($0.36 \leq y \leq 0.62$).

3. The semiconductor device according to claim 1, wherein the semiconductor device is a photodiode including the multiple quantum well structure as an absorption layer, and the multiple quantum well structure is a type II multiple quantum well structure which is composed of pairs of $In_xGa_{1-x}As$ ($0.38 \leq x \leq 0.68$) and $GaAs_{1-y}Sb_y$ ($0.36 \leq y \leq 0.62$), or pairs of $Ga_{1-u}In_uN_vAs_{1-v}$ ($0.4 \leq u \leq 0.8, 0 < v \leq 0.2$) and $GaAs_{1-y}Sb_y$ ($0.36 \leq y \leq 0.62$).

4. The semiconductor device according to claim 1, wherein the semiconductor device is a photodiode including the multiple quantum well structure as an absorption layer, and wherein responsivity of the photodiode to light of a wavelength of 2000 nm is 0.5 A/W or more.

5. The semiconductor device according to claim 1, wherein the semiconductor device is a photodiode including the multiple quantum well structure as an absorption layer, and wherein a dark current density of dark current under a condition that a reverse bias voltage is 5 V, with respect to an area of an absorption part of the photodiode, is 0.5 mA/cm² or less.

6. The semiconductor device according to claim 1, wherein in the semiconductor layer of the multiple quantum well structure and the layer including a group III -V compound semiconductor, a lattice mismatch $\Delta\omega$ with respect to the substrate is not less than −0.2% but not greater than 0.2%.

7. An imaging system including a semiconductor device that is disclosed in claim 1.

* * * * *

UNITED STATES PATENT AND TRADEMARK OFFICE
CERTIFICATE OF CORRECTION

PATENT NO. : 8,461,570 B2  Page 1 of 1
APPLICATION NO. : 13/127005
DATED : June 11, 2013
INVENTOR(S) : Fujii et al.

It is certified that error appears in the above-identified patent and that said Letters Patent is hereby corrected as shown below:

In the Claims:

At column 28, claim 3, line 19, "type H" should be --type II--.

Signed and Sealed this
Third Day of September, 2013

Teresa Stanek Rea
*Acting Director of the United States Patent and Trademark Office*